US006614219B2

(12) United States Patent  (10) Patent No.: US 6,614,219 B2
Dadian  (45) Date of Patent: Sep. 2, 2003

(54) METERING ASSEMBLY (75) Inventor: Michael Charles Dadian, Greenville, WI (US)

(73) Assignee: Eaton Corporation, Cleveland, OH (US)

( * ) Notice: Subject to any disclaimer, the term of this patent is extended or adjusted under 35 U.S.C. 154(b) by 0 days.

(21) Appl. No.: 10/035,024

(22) Filed: Dec. 21, 2001

(65) Prior Publication Data

US 2003/0117128 A1 Jun. 26, 2003

(51) Int. Cl.$^7$ .............................. G01R 11/32; H02B 1/00
(52) U.S. Cl. .................... 324/142; 361/659; 361/666
(58) Field of Search ........................... 324/158.1, 156, 324/157, 142; 361/659, 664, 666, 668, 818, 825

(56) References Cited

U.S. PATENT DOCUMENTS

| | | | |
|---|---|---|---|
| 3,746,936 A | | 7/1973 | Coffey et al. |
| 4,115,835 A | * | 9/1978 | Doby ........................ 361/665 |
| 4,404,521 A | * | 9/1983 | Fennell ..................... 324/110 |
| 5,587,917 A | | 12/1996 | Elms |
| 5,706,214 A | | 1/1998 | Putt et al. |
| 5,870,276 A | | 2/1999 | Leach et al. |

OTHER PUBLICATIONS

Cutler–Hammer, "Instructions for Installation, Operation, and Maintenance of Cutler–Hammer IQ 200 Electrical Distribution System Meter", TD 17558A, pp. cover, i–vi, 1–46, Mar. 2000.
ABB, "ALPHA(R) Meter—(ALPHA electricity electronic)", pp. 1–6, May 1, 2001.

* cited by examiner

*Primary Examiner*—Kamand Cuneo
*Assistant Examiner*—Russell M. Kobert
(74) *Attorney, Agent, or Firm*—Martin J. Moran (57) ABSTRACT A metering assembly includes an FT-21 kWh analog meter enclosure having an opening and carrying a plurality of stabs. A frame includes four sides, with the bottom side carrying a plurality of electrical terminals. The stabs electrically engage the frame terminals. A mechanism secures the frame within the enclosure opening. A display module includes a display port and a metering display driven from the display port. A monitoring module includes a monitoring unit, a display port driven by the monitoring unit, and a module enclosure having four sides. The monitoring module top side is mounted to the frame top side. The monitoring module bottom side has a plurality of electrical connections to the frame bottom side electrical terminals. The monitoring module display port is electrically connected to the display module display port. A mechanism mounts the display module to the frame offset from the monitoring module front side.

21 Claims, 11 Drawing Sheets

METERING ASSEMBLY

BACKGROUND OF THE INVENTION

1. Field of the Invention

The present invention is directed to meters and assemblies for housing meters and, more particularly, to meters providing monitoring, display and communication functions and to assemblies for such meters.

2. Background Information

Conventional analog kWh meters and enclosures therefor are well known in the art. See, for example, U.S. Pat. Nos. 3,746,936; and 5,870,276.

Recently, digital monitor/analyzers and digital kWh meters, which include substantially expanded monitoring and communication capabilities as compared to conventional meters, have been introduced. See, for example, U.S. Pat. No. 5,587,917.

For example, the IQ 200 Electrical Distribution System Meter marketed by Eaton/Cutler-Hammer of Pittsburgh, Pennsylvania, provides metered and monitored parameters such as: phase currents; line-to-line voltage; real, reactive and apparent power; energy (e.g., watt-hours, var-hours, VA hours); frequency; power factor; minimum/maximum values; system demand; and an ANSI standard KYZ pulse output, which provides suitable pulses in order to accumulate an accurate record of energy measures. The IQ 200 Meter also provides a communication interface to a computer network for data collection, storage or printout. Applications include, for example, industrial applications (e.g., paper manufacturing, automobile manufacturing), commercial buildings employing switchgear, utility applications, and unit substations.

The IQ 200 Meter consists of an IQ 200 Display Module and an IQ 220 Base Module. The front face of the Display Module forms an operator panel including a liquid crystal display screen, which presents system values and functions, and Menu, up/down Scroll, and Enter buttons, in order to allow the operator to view, change and reset system parameters. For example, the user may: (1) display measured system, phase, and minimum/maximum values; (2) view and edit all or individual setpoints (e.g., password, INCOM™ network address and baud rate, system frequency, wiring configuration, CT and PT ratios, demand window, and energy tracking (KYZ pulse output)); (3) view energy, and view and reset peak demands, and any or all individual minimum and maximum values; and (4) change the display for improved viewing. The operator panel is usually installed in order that it is visible and accessible from the outside of the panel or door into which it is mounted.

The Display Module is electrically connected to the Base Module by a suitable cable, which extends from the display port on the Base Module to the corresponding port on the Display Module.

The Base Module measures system values and provides metering data. The rear face of the Base Module includes current and voltage input terminals, power supply terminals, and the display port. The rear face of the Base Module also includes two input/output communication ports: a KYZ pulse initiator port, and an INCOM™ port.

Typically, the IQ 200 Meter is mounted in an electrical switchgear enclosure. Normally, the Display Module is door- or panel-mounted. When the Display Module is mounted in a panel, the Base Module is also mounted to panel behind the Display Module on a pair of U-shaped brackets. Otherwise, the Base Module may be remotely mounted using an L-shaped mounting bracket; mounted directly to a panel or floor; or attached to a DIN rail using a DIN clip. When the Base Module is mounted remotely, the chassis of the Display Module is connected to earth ground.

Figure 2:
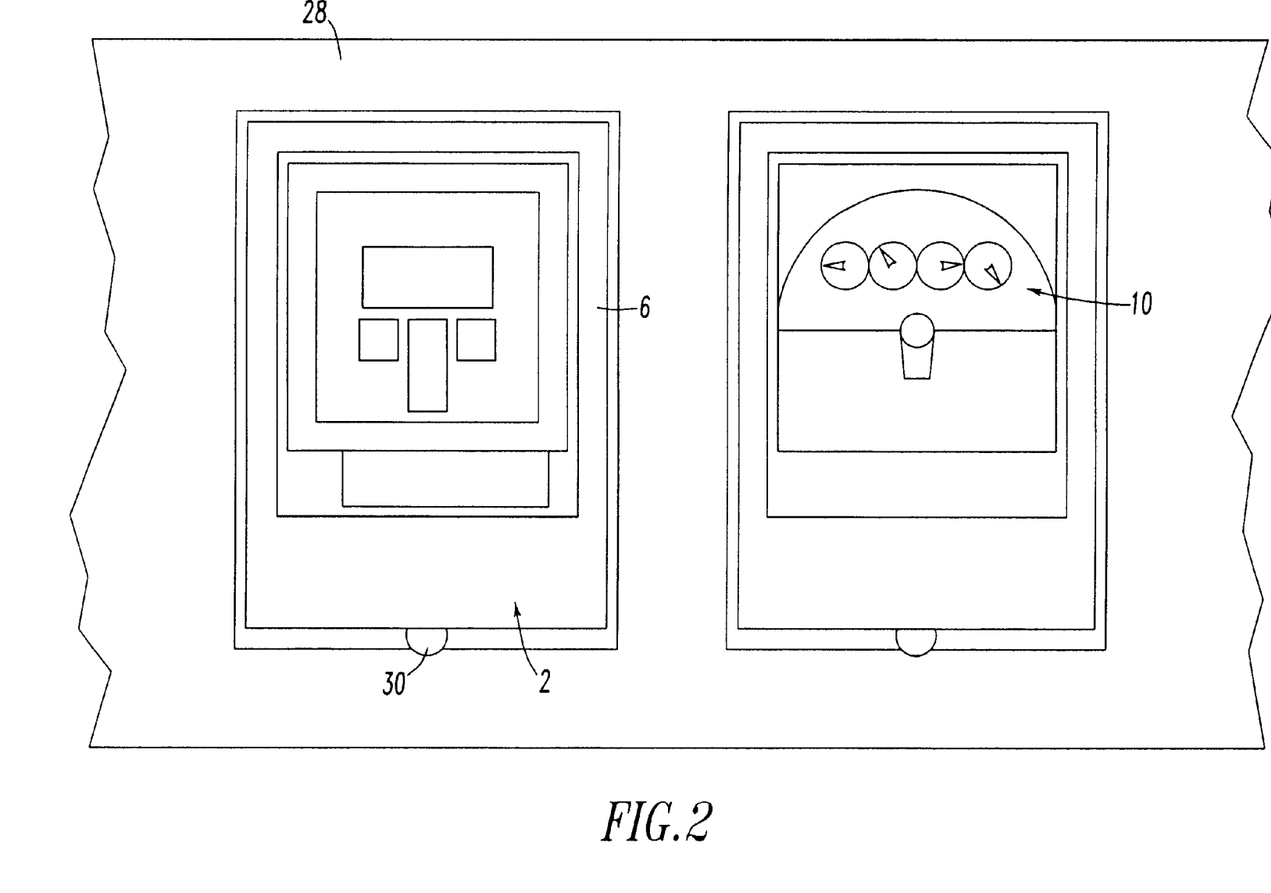
FIG. 2 is a plan view of a meter panel including the display of the metering assembly of FIG. 1 and a conventional analog kWh meter.

It is known to employ a conventional kWh meter having an analog display (i.e. a plurality of mechanical dials as shown in analog meter 10 of FIG. 2) in a FT-21 kWh analog meter case made by the former Westinghouse Electric Corporation.

It is also known to employ a kWh meter having an analog meter form factor and a conventional digital display (i.e. a display including a plurality of digits (e.g., each showing the numbers 0–9)) in such a FT-21 kWh analog meter case.

There is room for improvement in meters and housings for meters.

There exists the need to retrofit existing meter cases, in order to provide additional metering capabilities.

There also exists the need to provide suitable enclosures for meters for new construction.

SUMMARY OF THE INVENTION

These needs and others are met by the present invention, which provides enhanced display, metering, monitoring and/or communication capabilities in a meter enclosure adapted for housing a conventional analog kWh meter.

As one aspect of the invention, a metering assembly comprises: a meter enclosure adapted for housing an analog kWh meter, the meter enclosure having an opening and carrying a plurality of stabs; a frame including a first side, a second side, a third side and a fourth side, the fourth side of the frame carrying a plurality of electrical terminals, the stabs of the meter enclosure electrically engaging the electrical terminals of the frame; means for securing the frame within the opening of the meter enclosure; a display module including a display port and a metering display driven from the display port; a monitoring module including a monitoring unit, a display port driven by the monitoring unit, and a module enclosure having a first side, a second side, a third side and a fourth side, the first side of the monitoring module being mounted to the first side of the frame, the fourth side of the monitoring module having a plurality of electrical connections to the electrical terminals of the fourth side of the frame, the display port of the monitoring module being electrically connected to the display port of the display module; and means for mounting the display module to the frame offset from the second side of the monitoring module.

The front cover may have an opening, and the metering display of the display module may be accessible through the opening of the front cover. The display module may include a plurality of buttons, which are accessible through the opening of the front cover. The display port of the monitoring module may include a communication cable electrically connected between the display port of the monitoring module and the display port of the display module.

As another aspect of the invention, a metering assembly comprises: a meter enclosure adapted for housing an analog kWh meter, the meter enclosure having an opening and carrying a plurality of stabs; a frame including a first side, a second side, a third side and a fourth side, the fourth side of the frame carrying a plurality of electrical terminals, the stabs of the meter enclosure electrically engaging the electrical terminals of the frame; means for securing the frame within the opening of the meter enclosure; a display module including a display port and a metering display driven from the display port; a monitoring and communication module including a monitoring unit, a display port driven by the monitoring unit, at least one communication port to or from the monitoring unit, and a module enclosure having a first side, a second side, a third side and a fourth side, the first side of the monitoring and communication module being mounted to the first side of the frame, the fourth side of the monitoring and communication module having a plurality of electrical connections to the electrical terminals of the fourth side of the frame, the display port of the monitoring and communication module being electrically connected to the display port of the display module; means for mounting the display module to the frame offset from the second side of the monitoring and communication module; a communication bracket including at least one communication connector electrically connected to the at least one communication port of the monitoring and communication module; and means for mounting the communication bracket to the frame offset from the third side of the monitoring and communication module.

The monitoring and communication module may include a plurality of communication ports, and the communication bracket may include a plurality of communication connectors electrically connected to the communication ports of the monitoring and communication module. The meter enclosure may include a side facing the third side of the module enclosure, the side facing the third side of the module enclosure having a plurality of openings for accepting the communication connectors.

The means for mounting the communication bracket to the frame offset from the third side of the monitoring and communication module may include means for mounting the communication bracket to the means for mounting the display module.

The communication bracket may comprise a U-shaped board having a base and a pair of legs, a printed circuit board mounted to the base between the legs, the printed circuit board carrying the at least one communication connector and having at least one communication cable electrically connected between the at least one communication port of the monitoring and communication module and the at least one communication connector.

The means for mounting the display module to the frame offset from the second side of the monitoring module may comprise a first bracket having a first leg mounted proximate the second side of the frame and having a second leg offset from the second side of the monitoring module, a second bracket having a first leg mounted proximate the third side of the frame and having a second leg offset from the second side of the monitoring module; and a pair of U-shaped brackets, with each of the U-shaped brackets having a pair of legs mounted to corresponding portions of the display module and having a base mounted to the second legs of the first and second brackets. The communication bracket may include a first fastener secured to the first leg of the first bracket and a second fastener secured to first leg of the second bracket.

As another aspect of the invention, a metering assembly comprises: a meter enclosure adapted for housing an analog kWh meter, the meter enclosure having an opening and carrying a plurality of stabs; a frame including a top side and a bottom side, the bottom side of the frame carrying a plurality of electrical terminals, the stabs of the meter enclosure electrically engaging the electrical terminals of the frame; means for securing the frame within the opening of the meter enclosure; a display module including a display port and a metering display driven from the display port; a monitoring module including a monitoring unit, a display port driven by the monitoring unit, and a module enclosure having a top side, a front side and a bottom side, the top side of the monitoring module being mounted to the top side of the frame, the bottom side of the monitoring module having a plurality of electrical connections to the electrical terminals of the bottom side of the frame, the display port of the monitoring module being electrically connected to the display port of the display module; and means for mounting the display module to the frame offset from the front side of the monitoring module.

BRIEF DESCRIPTION OF THE DRAWINGS

A full understanding of the invention can be gained from the following description of the preferred embodiments when read in conjunction with the accompanying drawings in which.

DESCRIPTION OF THE PREFERRED EMBODIMENTS

Figure 1:
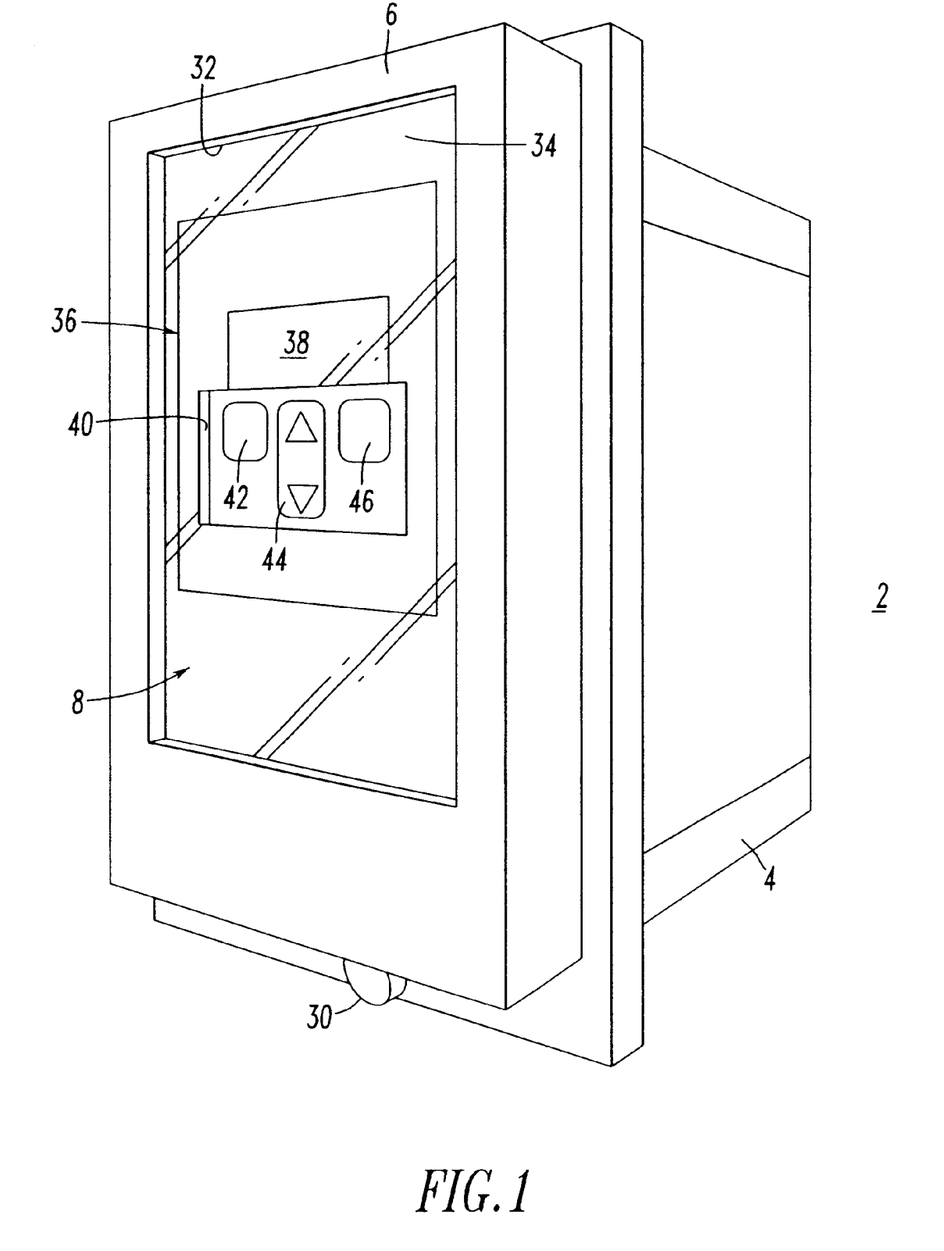
FIG. 1 is an isometric view of a power management metering assembly including a display, monitoring and communication sub-assembly and a meter enclosure in accordance with the present invention.
Figure 6:
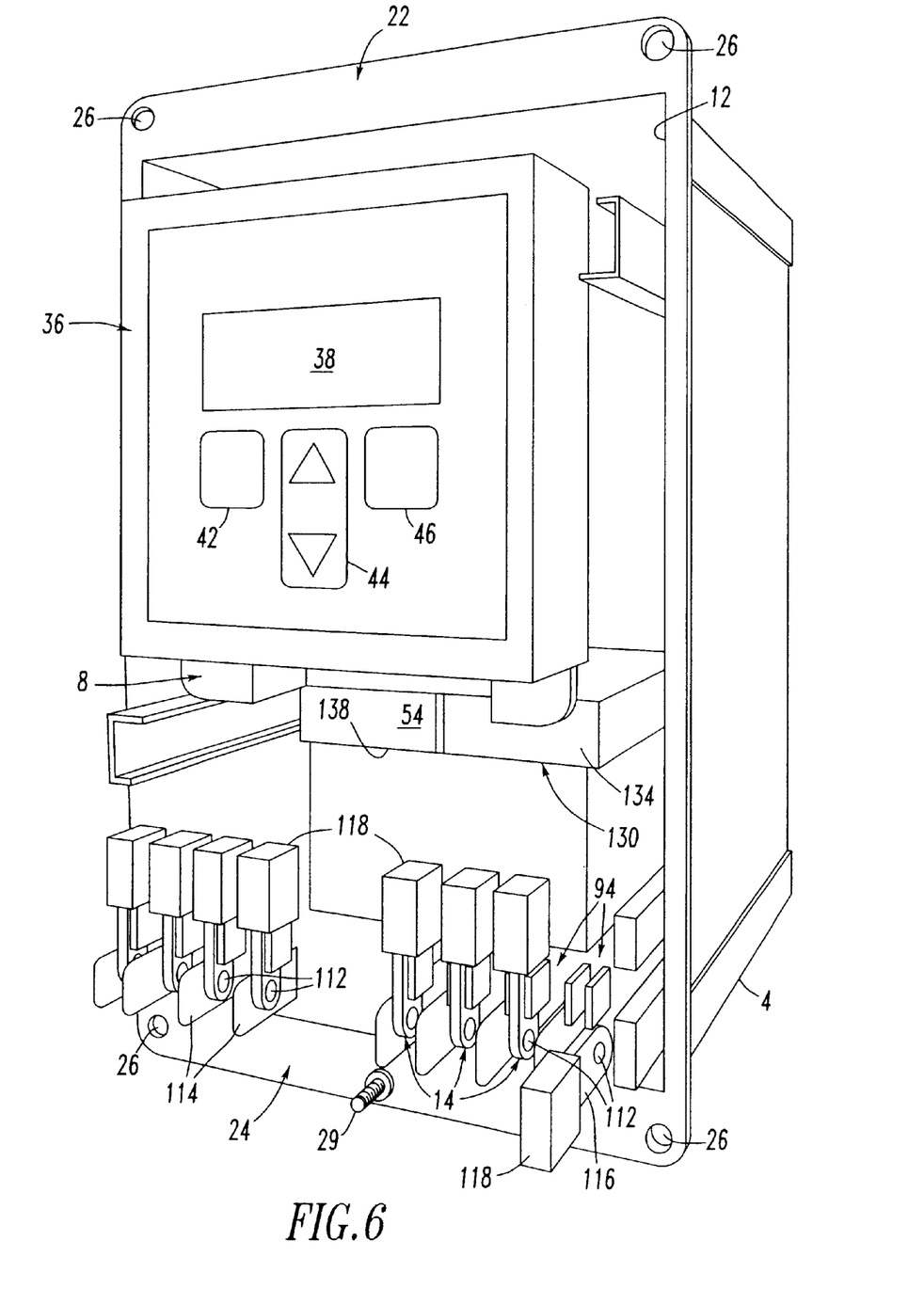
FIG. 6 is a front view of the metering assembly of FIG. 1 with the front cover removed.
Figure 13:
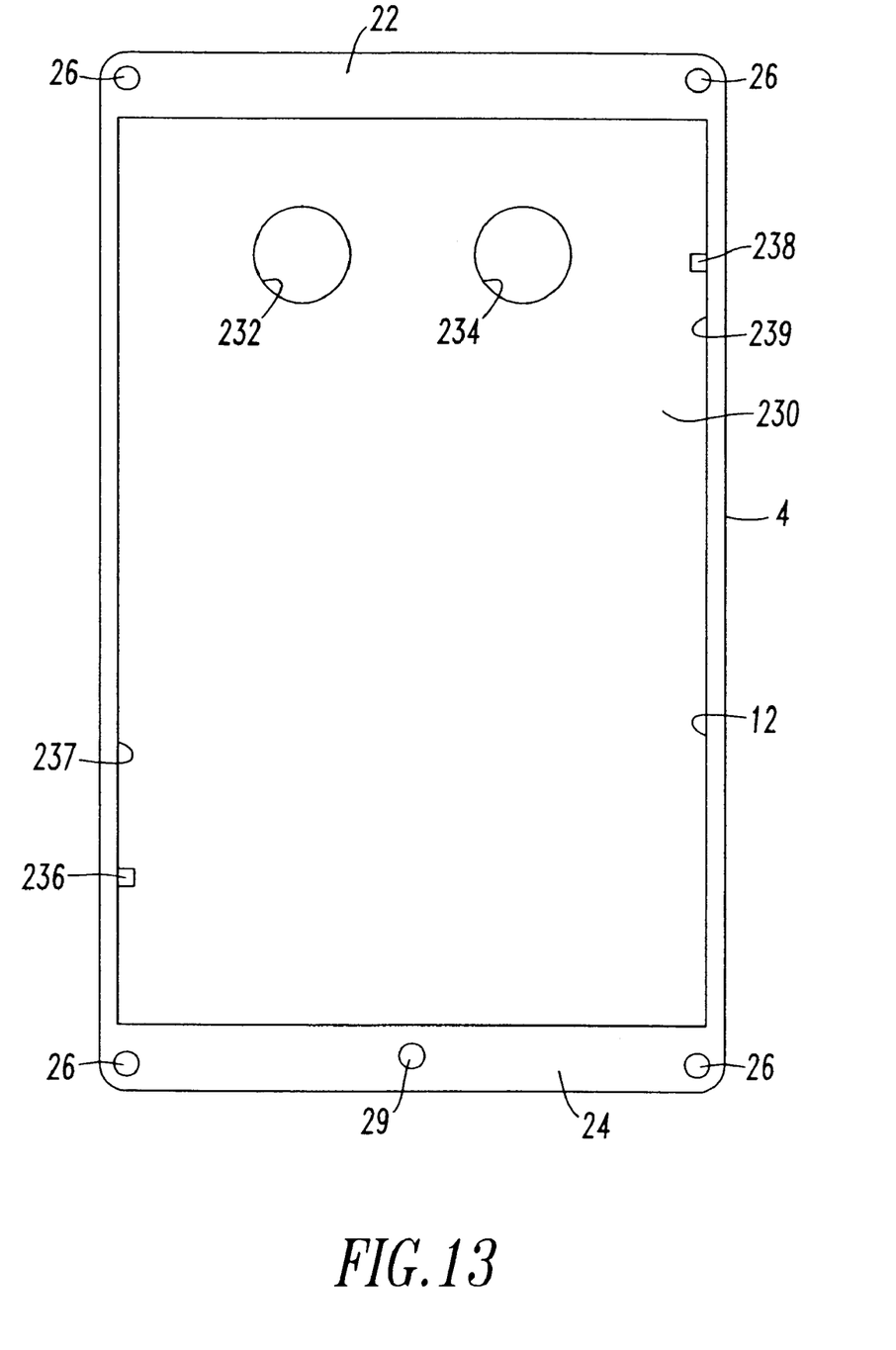
FIG. 13 is a simplified plan view of the meter enclosure of FIG. 1.

Referring to FIG. 1, a power management metering assembly 2 is shown. The metering assembly 2 includes a sub-assembly housing or meter enclosure 4 (shown in FIGS. 1, 6 and 13), a front cover 6 (shown in FIGS. 1 and 10), and a display, monitoring and communication sub-assembly 8 (shown in FIGS. 1 and 3–7). As shown in FIG. 6, and except as modified as shown in FIG. 13, the enclosure 4 is a conventional FT-21 kWh analog meter case made by ABB of Coral Springs, Fla., a successor to the former Westinghouse Electric Corporation. The enclosure 4 is adapted for housing a conventional analog kWh meter 10 (as shown in FIG. 2).

Figure 11:
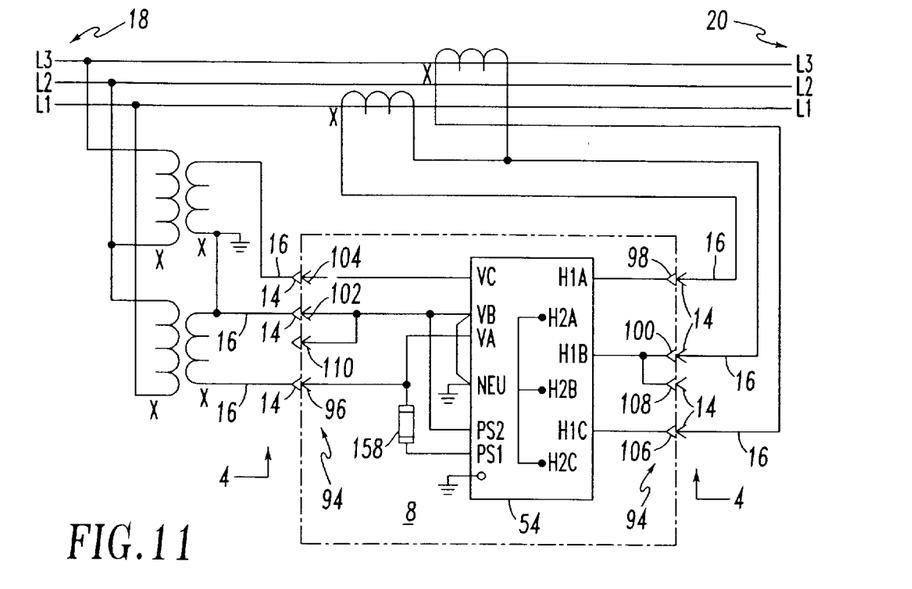
FIG. 11 is a block diagram in schematic form showing the line side and load side electrical connections between the switchgear and the terminals of the metering assembly of FIG. 1.

Continuing to refer to FIG. 6, the enclosure 4 has an opening 12 and carries a plurality of stabs 14. In turn, the stabs 14 are electrically connected to terminals 16 (as shown in FIG. 11), which are adapted for electrical connection to the line side 18 and load side 20 of switchgear. The enclosure 4 has a pair of flanges 22 and 24 disposed proximate the opening 12 at the respective top and bottom (with respect to FIG. 6) of the enclosure. The flanges 22,24 have openings 26 for mounting the assembly 2 to the rear (not shown) of a meter panel 28 with conventional fasteners (not shown) as shown in FIG. 2. The front cover 6 is disposed over the enclosure opening 12 and is secured to a threaded post 29 on the lower flange 24 by a pivotally captured mating fastener 30 in the corresponding lower portion of the front cover.

Figure 10:
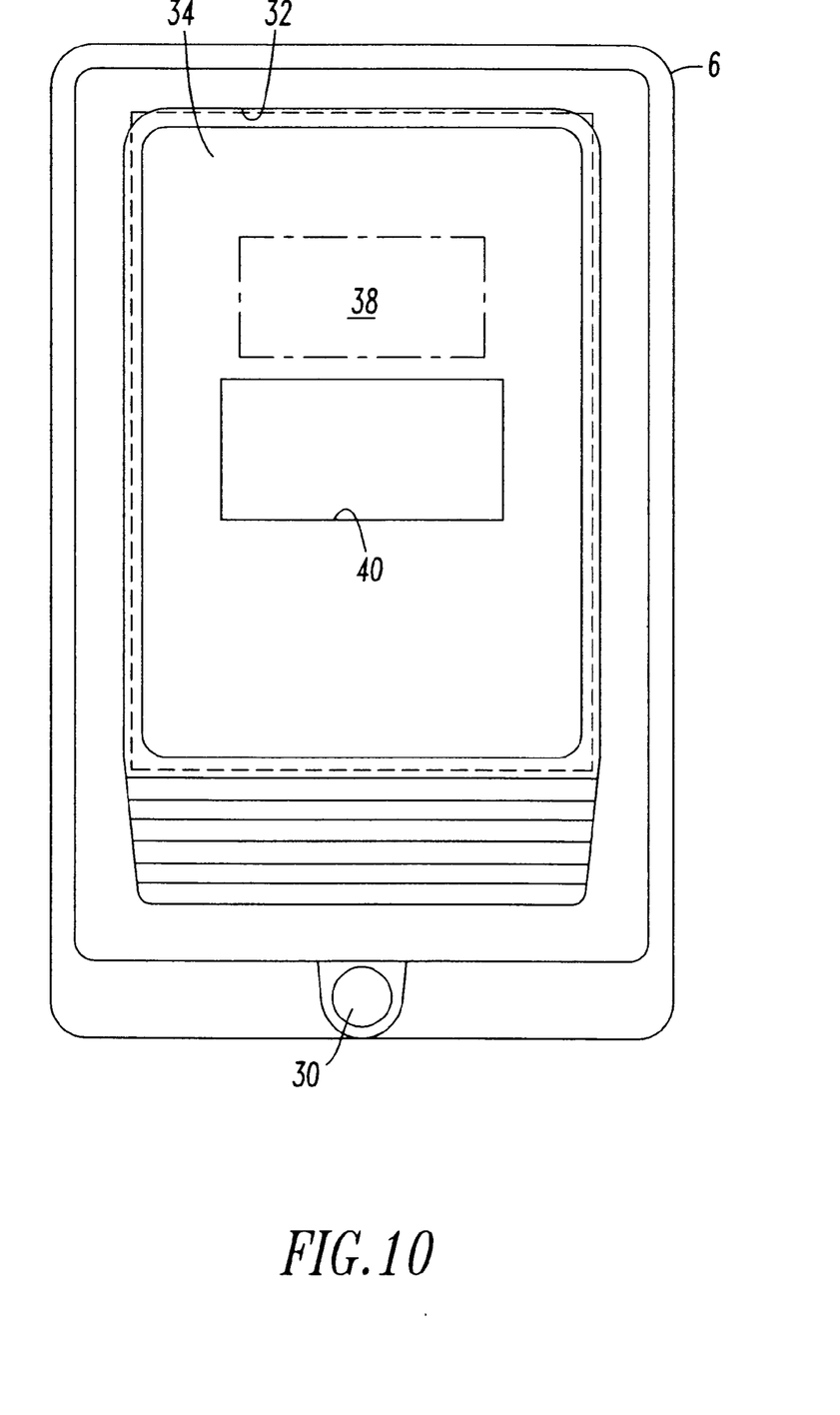
FIG. 10 is a plan view of the front cover of the metering assembly of FIG. 1 showing a display window with an opening for access to the menu, scroll and enter buttons.

Referring to FIGS. 1 and 10, the front cover 6 includes an opening 32 having a transparent display window 34 suitably retained therein by clips (not shown). The display, monitoring and communication sub-assembly 8 includes a display module 36 having a digital metering display 38, which is viewable by a user through the opening 32 and through the transparent display window 34 of the front cover 6. The display window 34 has a relatively smaller opening 40, through which the user may access a menu button 42, two scroll buttons 44 and an enter button 46 of the display module 36.

Referring to FIGS. 3–5 and 7, the display, monitoring and communication sub-assembly 8 is shown. The sub-assembly 8 includes a frame 48, a pair of mechanisms 50,52 for securing the frame 48 within the opening 12 of the enclosure 4 of FIG. 6, the display module 36, a monitoring and communication module 54, a mechanism 56 for mounting the display module 36 to the frame 48, a communication bracket 58, and a mechanism 60 for mounting the communication bracket 58 to the frame 48. In the exemplary embodiment, the display module 36 is an IQ 200 Display Module and the monitoring and communication module 54 is an IQ 220 Base Module marketed by Eaton/Cutler-Hammer.

Figure 4:
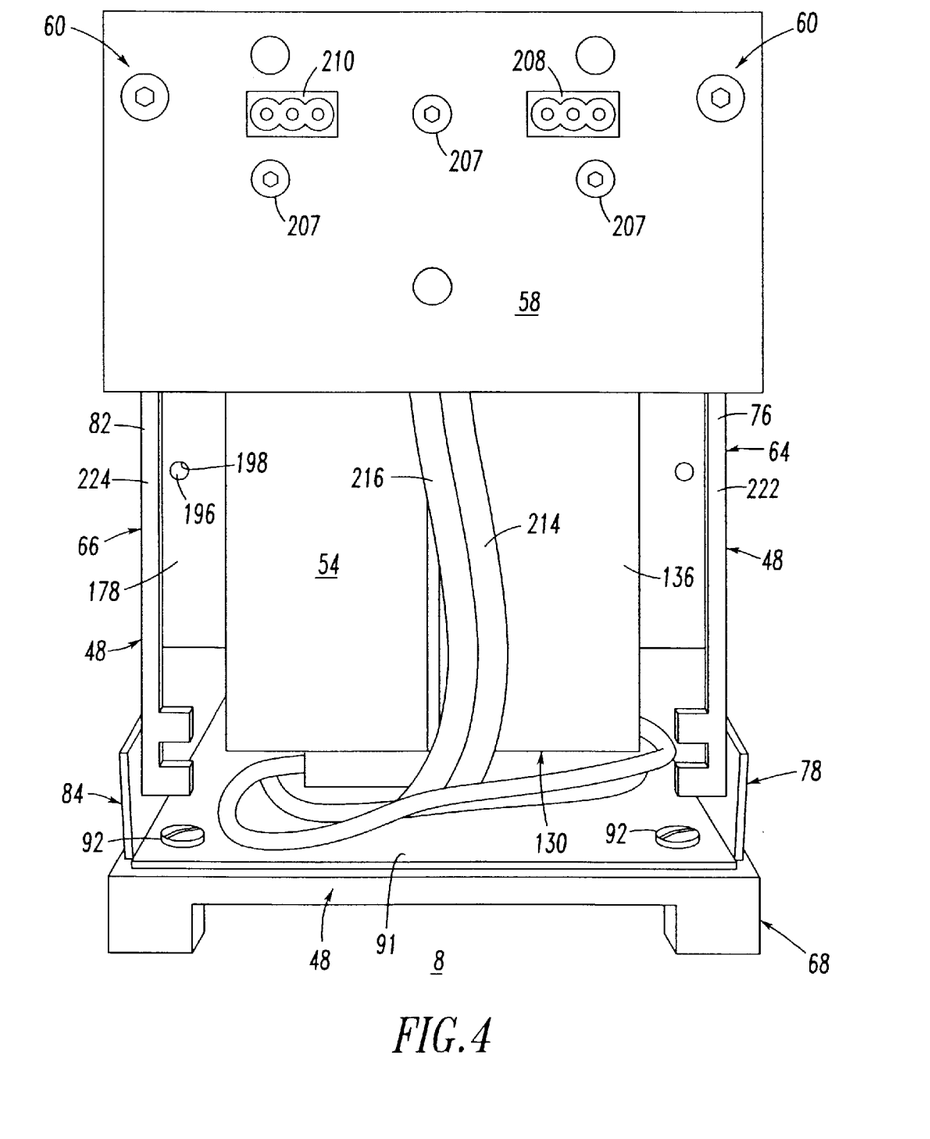
FIG. 4 is a rear view of the display, monitoring and communication sub-assembly of FIG. 1 as removed from the meter enclosure to show the frame, monitoring and communication module, communication bracket and meter brackets.
Figure 5:
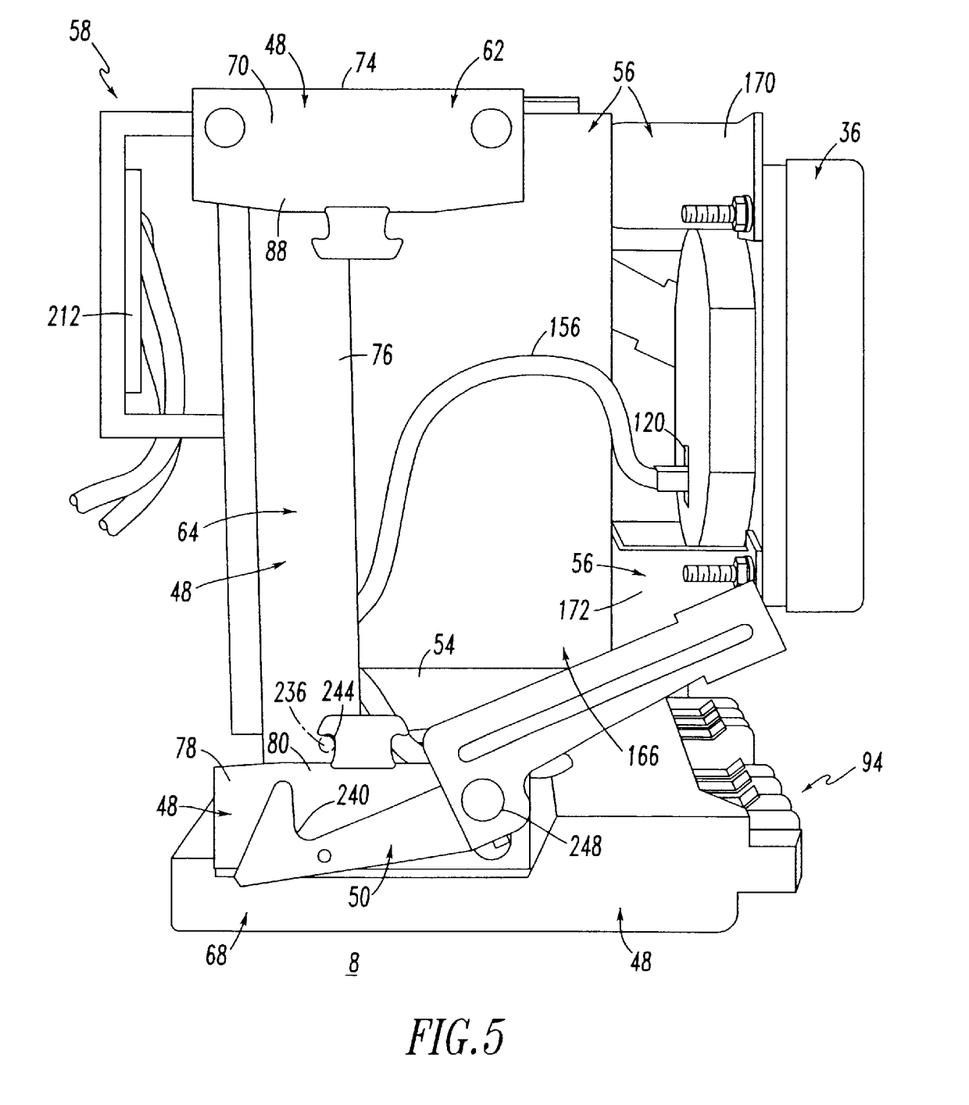
FIG. 5 is a left side view of the display, monitoring and communication sub-assembly of FIG. 1 as removed from the meter enclosure to show the frame, communication bracket and communication connector board, monitoring and communication module, display module, RS-485 cable from the monitoring and communication module to the display module display port, left side meter bracket, and left side latch.

The frame 48 includes a first side, such as U-shaped top portion 62, a second side, such as left side 64, a third side, such as right side 66, and a fourth side, such as molded base 68. The U-shaped top portion 62 includes a left side leg 70, a right side leg 72 and a common base 74. The left side 64 includes a vertical side member 76 and an L-shaped base member 78, which are suitably welded together at 80. In a similar manner, the right side 66 includes a vertical side member 82 and an L-shaped base member 84, which are suitably welded together at 86. The left side leg 70 of the U-shaped top portion 62 is suitably welded to the left side 64 at 88, and the right side leg 72 of the U-shaped top portion 62 is suitably welded to the right side 66 at 90. As shown in FIG. 4, the four-sided frame 48 is completed by securing the left side (on the right side of FIG. 4) L-shaped base member 78 and the right side (on the left side of FIG. 4) L-shaped base member 84 to the molded base 68 with suitable fasteners 92 through openings (not shown) in the members 78,84 and openings (not shown) in the molded base 68. In the exemplary embodiment, the molded base 68 has an opening (not shown) beneath the monitoring and communication module 54 and, hence, a suitable insulator 91 is positioned over that opening and is also secured to the base 68 by the fasteners 92.

Figure 7:
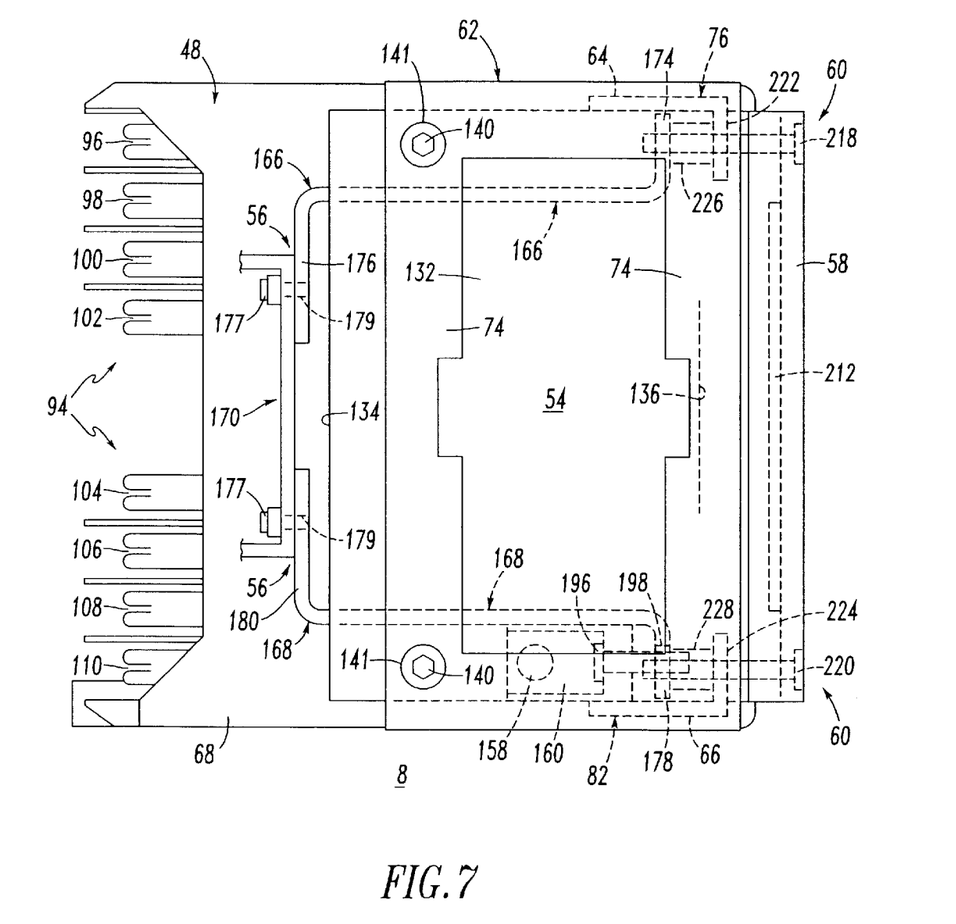
FIG. 7 is a simplified, cut-way, top view of the display, monitoring and communication sub-assembly of FIG. 1 showing the frame, monitoring and communication module, communication bracket, meter brackets and fuse holder.

As best shown in FIGS. 7 and 11, the molded base 48 carries eight exemplary electrical terminals 94 including 96,98,100,102,104,106,108,110. As best shown in FIGS. 6 and 11, the female drawout terminals 94 are electrically engaged by the male stabs 14. As is conventional, as shown in FIG. 6, the stabs 14 have a first end 112, which is pivotally mounted in a molded portion 114 of the enclosure 4, a second end 116, which engages a corresponding one of the female terminals 94, and an insulating portion 118. In this manner, the terminals 94 of the sub-assembly 8 are electrically interconnected with the line and load sides 18,20 of the switchgear through the stabs 14 and the enclosure terminals 16. This advantageously permits the sub-assembly 8 to be electrically disconnected and drawn-out of the enclosure 4 for maintenance.

Figure 3:
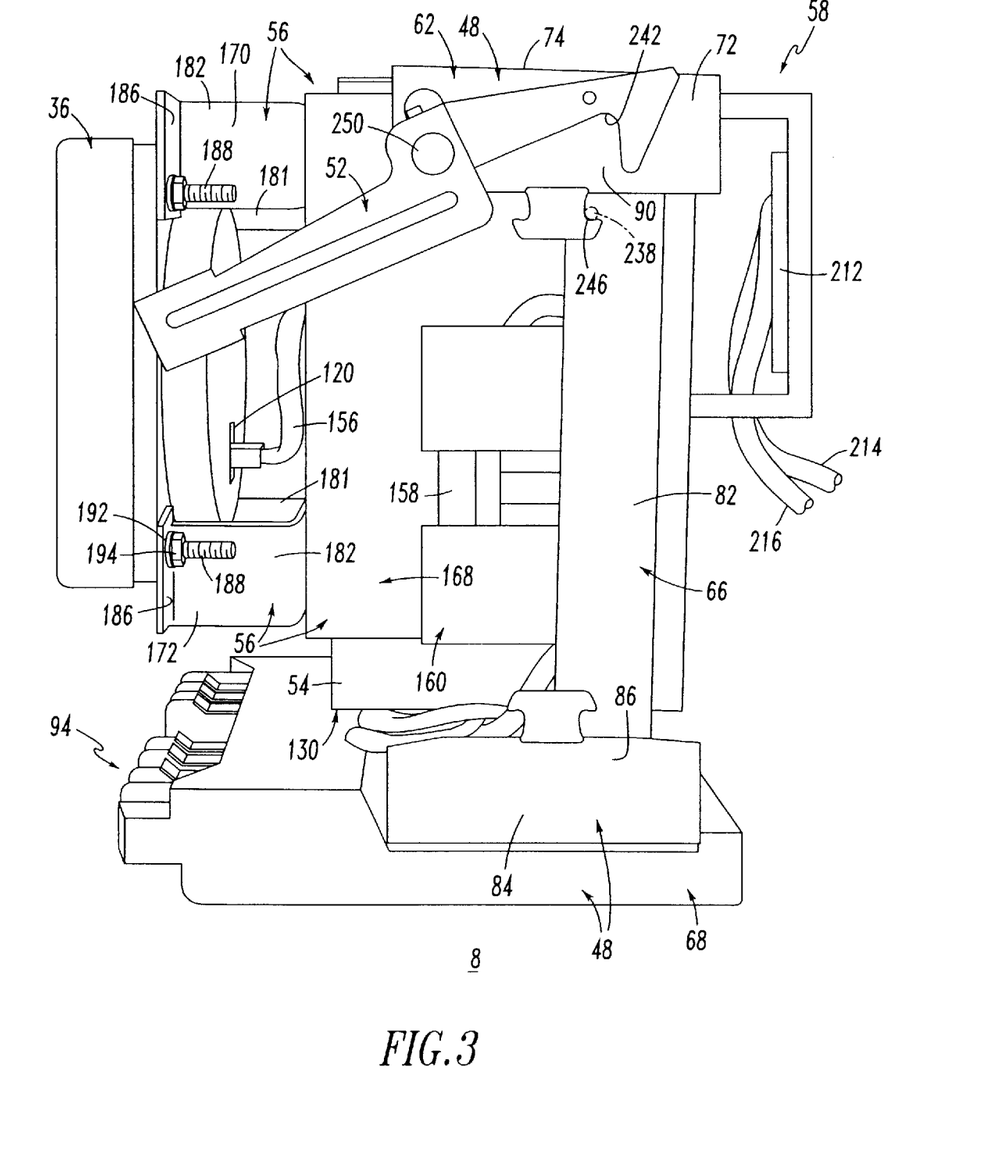
FIG. 3 is right side view of the display, monitoring and communication sub-assembly of FIG. 1 as removed from the meter enclosure to show the frame, communication bracket and communication connector board, monitoring and communication module, fuse holder, display module, right side meter bracket, and right side latch.

As shown in FIGS. 3 and 6, the display module 36 includes a display port 120 and the metering display 38, which is driven from that display port.

Figure 12:
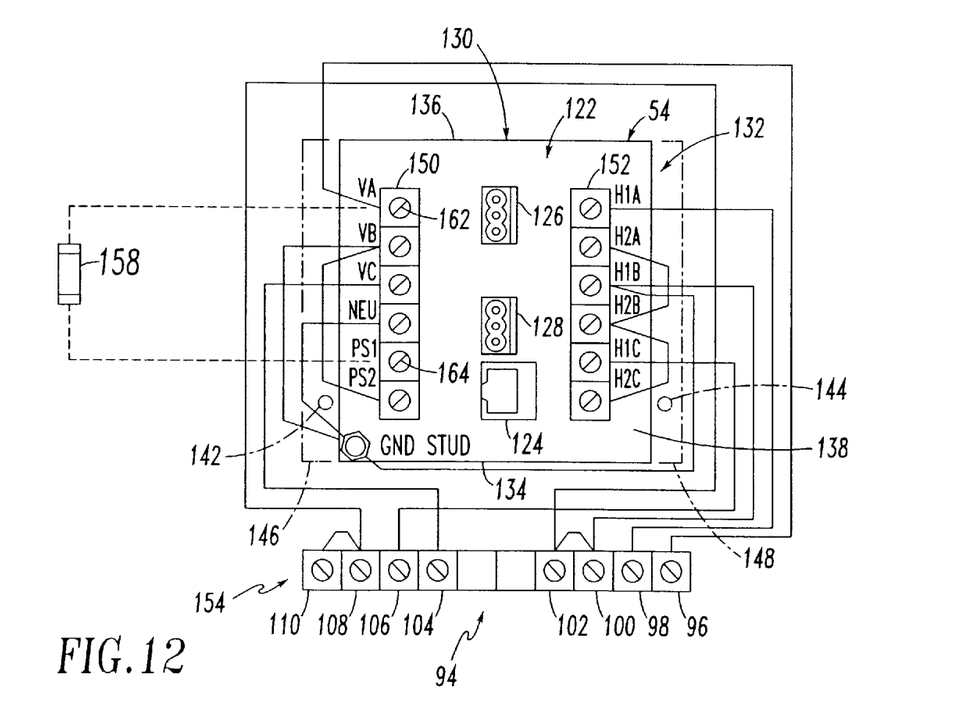
FIG. 12 is a block diagram in schematic form showing the electrical connections between the terminals and the monitoring and communication module of the metering assembly of FIG. 1.

As shown in FIG. 12, the monitoring and communication module 54 includes a power monitoring unit 122, a display port 124 driven by the monitoring unit 122, one or two communication ports 126,128 to or from the monitoring unit 122, and a module enclosure 130 having a first or top side 132 (shown in phantom line drawing in FIG. 12), a second or front side 134, a third or back side 136, and a fourth or bottom side 138 (as shown in FIG. 6 and as best shown in FIG. 12).

As shown in FIG. 7, the top side 132 of the module 54 is mounted to the common base 74 of the U-shaped top portion 62 of the frame 48 by a pair of suitable fasteners 140 (e.g., screws, washers and nuts), which pass through corresponding openings 141 in the common base 74 and through corresponding openings 142,144 in respective flange portions 146,148 of the module top side 132 as shown in FIG. 12.

Continuing to refer to FIG. 12, the bottom side 138 of the module 54 includes a pair of terminal blocks 150,152, which are suitably electrically connected (e.g., with #14 AWG wiring having terminal lugs at each end) with mating screw terminal portions 154 of the electrical terminals 94 in the manner shown in FIGS. 11 and 12.

Also referring to FIG. 3, the display port 124 of the module 54 is electrically connected to the display port 120 of the display module 36 by a suitable RS-485 cable 156. A suitable fuse 158 is mounted in a fuse holder 160. The fuse 158 is electrically connected between the terminal 162, which is electrically connected to the terminal 96, and the terminal 164 of the terminal block 150.

Figure 8:
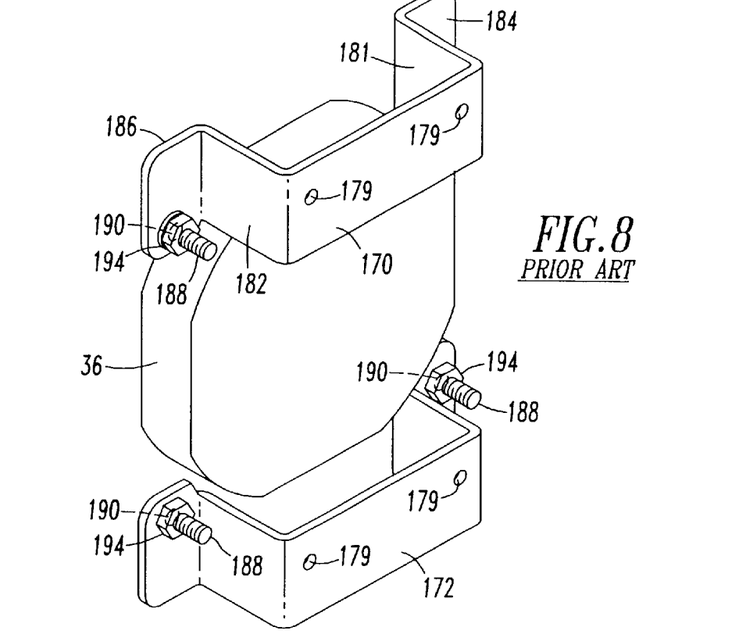
FIG. 8 is an isometric view of the metering display and two U-shaped meter brackets of the display, monitoring and communication sub-assembly of FIG. 3.

Referring to FIGS. 3–5 and 7–9, the mechanism 56 for mounting the display module 36 to the frame 48 includes first and second double-dog-leg brackets 166,168 (as best shown in FIG. 7) and first and second U-shaped brackets 170,172 (as best shown in FIG. 8). As best shown in FIG. 7, the first bracket 166 has a first leg 174 mounted proximate the second side 64 of the frame 48 and has a second leg 176 offset from the second side 134 of the monitoring and communication module 54. Similarly, the second bracket 168 has a first leg 178 mounted proximate the third side 66 of the frame 48 and has a second leg 180 offset from the second side 134 of the module 54. The brackets 166,168 permit the display module 36 and the brackets 170,172 to be mounted to the frame 48, albeit suitably offset from the front side 134 of the monitoring and communication module 54. The U-shaped brackets 170,172 are mounted to the second legs 176,180 of the respective brackets 166,168 by suitable fasteners 177 which pass through bracket openings 179 (as shown with brackets 166,168,170 of FIG. 7).

As shown in FIGS. 3 and 8, each of the U-shaped brackets 170,172 includes a pair of legs 181,182 having respective feet 184,186 mounted to threaded post portions 188 of the display module 36. The threaded post portions 188 pass through openings 190 in the feet 184,186. In turn, the brackets 170,172 are suitably secured to the post portions 188 and, thus, to the display module 36 by washers 192 and nuts 194.

As shown in FIGS. 3, 4 and 7, the fuse holder 160 is advantageously mounted to the leg 178 of the bracket 168 by a threaded fastener 196, which engages the leg at opening 198 (as best shown in FIGS. 4 and 7).

Figure 9:
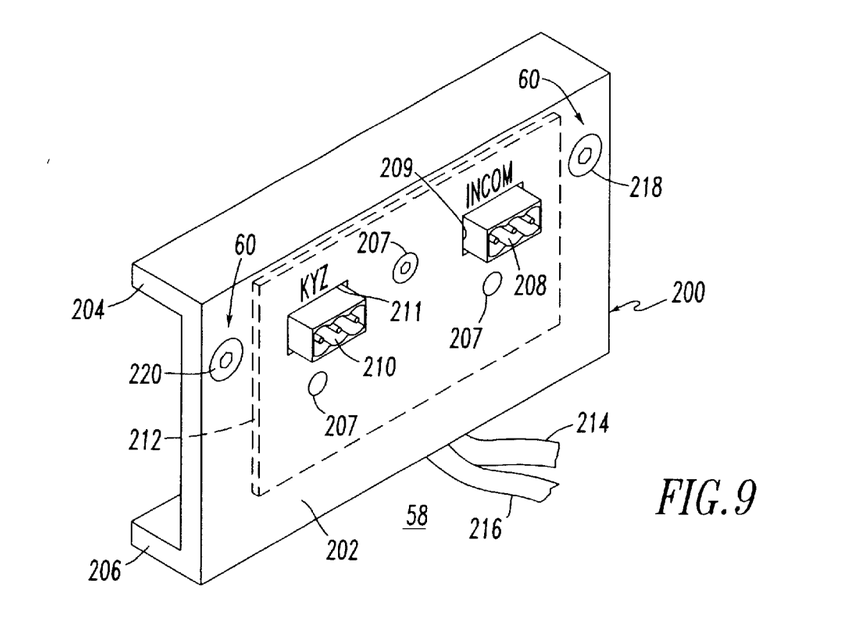
FIG. 9 is an isometric view of the communication bracket and connector board of the display, monitoring and communication sub-assembly of FIG. 3 showing the INCOM and KYZ (pulse) connectors.

Referring to FIG. 9, the communication bracket 58 of the display, monitoring and communication sub-assembly 8 of FIG. 3 is shown. The bracket 58 includes a U-shaped board 200 made of a suitable insulating composite material having a base 202 and a pair of legs 204,206, an INCOM connector 208 protruding through opening 209, a KYZ (pulse) connector 210 protruding through opening 211, and a communication connector printed circuit board (PCB) 212 mounted to the base 202 between the legs 204,206 by suitable fasteners 207. The PCB 212 carries the two connectors 208,210 and has communication cables 214,216 (shown in FIG. 4) electrically connected between the communication ports 126,128 (shown in FIG. 12), respectively, of the monitoring and communication module 54 and such connectors 208,210 through printed circuit traces (not shown) of PCB 212.

Referring again to FIG. 7, the mechanism 60 for mounting the communication bracket 58 to the frame 48 offset from the third or back side 136 of the monitoring and communication module 54 includes a first fastener 218 secured to the first leg 174 of the first bracket 166 and a second fastener 220 secured to the first leg 178 of the second bracket 168. As shown in FIGS. 4 and 7, the vertical side members 76,82 have an L-shape with respective portions 222,224 disposed toward the rear of the frame 48. As shown in FIG. 7, threaded spacers 226,228 are disposed between the rear sides of the first legs 174,178 and the front sides of side member portions 222,224, respectively. The fasteners 218, 220 engage both spacers 226,228 and the bracket legs 174,178, respectively, and, thus, suitably secure both the communication bracket 58 and the brackets 166,168 to the frame 48.

As shown in FIG. 13, the enclosure 4 has an internal side or surface 230, which faces the rear side 136 of the module enclosure 130 of FIG. 4 and, thus, faces the connectors 208 and 210 of the communication bracket 58. The surface 230 includes a pair of openings 232,234 for accepting the respective communication connectors 208,210, which pass through such openings to the rear of the enclosure 4, in order to permit user access thereto.

Referring again to FIGS. 3, 5 and 13, the mechanisms 50,52 for securing the frame 48 within the opening 12 of the enclosure 4, employ a first tab 236 disposed on a first internal enclosure side 237, and a second tab 238 on a second internal enclosure side 239. The first pivotal latch member 50 includes a first hook member 240, which engages the first tab 236, and the second pivotal latch member 52 includes a second hook member 242 engages the second tab 238. Also, the frame 48 includes a third hook member, fixed hook 244, which cooperates with the first movable hook member 240 to capture the first tab 236. Similarly, the frame 48 includes a fourth hook member, fixed hook 246, which cooperates with the second movable hook member 242 to capture the second tab 238. The pivotal latch members 50 and 52 are pivotally mounted to the L-shaped base member 78 and the U-shaped top portion 62 at pivot points 248 and 250, respectively.

The exemplary power management metering assembly 2 is preferably employed as a retrofit into a modified FT-21 kWh analog meter case, such as enclosure 4, in order to provide communication capabilities and/or to replace an existing analog kWh meter, such as 10, or other non-communicating meter and to provide enhanced display, metering, monitoring and/or communication functions therein. Alternatively, the power management metering assembly 2 may be employed in new construction.

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of invention which is to be given the full breadth of the claims appended and any and all equivalents thereof.

What is claimed is:

1. A metering assembly comprising:

a meter enclosure adapted for housing an analog kWh meter, said meter enclosure having an opening and carrying a plurality of stabs;

a frame including a first side, a second side, a third side and a fourth side, the fourth side of said frame carrying a plurality of electrical terminals, the stabs of said meter enclosure electrically engaging the electrical terminals of said frame;

means for securing said frame within the opening of said meter enclosure;

a display module including a display port and a metering display driven from said display port;

a monitoring module including a monitoring unit, a display port driven by said monitoring unit, and a module enclosure having a first side, a second side, a third side and a fourth side, the first side of said monitoring module being mounted to the first side of said frame, the fourth side of said monitoring module having a plurality of electrical connections to the electrical terminals of the fourth side of said frame, the display port of said monitoring module being electrically connected to the display port of said display module; and means for mounting said display module to said frame offset from the second side of said monitoring module.

2. The metering assembly of claim 1 wherein said meter enclosure includes a plurality of flanges proximate the opening thereof, said flanges being adapted to mount to a meter panel.

3. The metering assembly of claim 1 wherein the electrical terminals of said frame are female drawout terminals.

4. The metering assembly of claim 1 wherein the stabs of said meter enclosure are electrically connected to terminals, which are adapted for electrical connection to switchgear.

5. The metering assembly of claim 1 wherein said meter enclosure has a first internal side having a first tab and a second internal side having a second tab; and wherein said means for securing said frame within the opening of said meter enclosure includes a first pivotal latch member which engages said first tab, and a second pivotal latch member which engages said second tab.

6. The metering assembly of claim 5 wherein said frame includes a first hook member on the second side of said frame and a second hook member on the third side of said frame; wherein said first pivotal latch member has a third hook member which cooperates with said first hook member to capture said first tab; and wherein said second pivotal latch member has a fourth hook member which cooperates with said second hook member to capture said second tab.

7. The metering assembly of claim 1 wherein said meter enclosure includes a cover disposed over the opening thereof.

8. The metering assembly of claim 7 wherein said cover is a front cover having an opening; and wherein the metering display of said display module is accessible through the opening of said front cover.

9. The metering assembly of claim 8 wherein said display module includes a plurality of buttons, which are accessible through the opening of said front cover.

10. The metering assembly of claim 1 wherein said monitoring module includes a fuse electrically connected between one of said electrical connections and one of the electrical terminals of the fourth side of said frame.

11. The metering assembly of claim 1 wherein the display port of said monitoring module includes a communication cable electrically connected between the display port of said monitoring module and the display port of said display module.

12. The metering assembly of claim 1 wherein said means for mounting said display module to said frame offset from the second side of said monitoring module comprises a first bracket having a first leg mounted proximate the second side of said frame and having a second leg offset from the second side of said monitoring module, a second bracket having a first leg mounted proximate the third side of said frame and having a second leg offset from the second side of said monitoring module, and means for mounting said display module to the second legs of said first and second brackets.

13. The metering assembly of claim 12 wherein said means for mounting said display module to said frame offset from the second side of said monitoring module further comprises a pair of U-shaped brackets, with each of said U-shaped brackets having a pair of legs mounted to corresponding portions of said display module and having a base mounted to the second legs of the first and second brackets.

14. A metering assembly comprising:
a meter enclosure adapted for housing an analog kWh meter, said meter enclosure having an opening and carrying a plurality of stabs;
a frame including a first side, a second side, a third side and a fourth side, the fourth side of said frame carrying a plurality of electrical terminals, the stabs of said meter enclosure electrically engaging the electrical terminals of said frame;
means for securing said frame within the opening of said meter enclosure;
a display module including a display port and a metering display driven from said display port;
a monitoring and communication module including a monitoring unit, a display port driven by said monitoring unit, at least one communication port to or from said monitoring unit, and a module enclosure having a first side, a second side, a third side and a fourth side, the first side of said monitoring and communication module being mounted to the first side of said frame, the fourth side of said monitoring and communication module having a plurality of electrical connections to the electrical terminals of the fourth side of said frame, the display port of said monitoring and communication module being electrically connected to the display port of said display module;
means for mounting said display module to said frame offset from the second side of said monitoring and communication module;
a communication bracket including at least one communication connector electrically connected to said at least one communication port of said monitoring and communication module; and
means for mounting said communication bracket to said frame offset from the third side of said monitoring and communication module.

15. The metering assembly of claim 14 wherein said monitoring and communication module includes a plurality of communication ports; and wherein said communication bracket includes a plurality of communication connectors electrically connected to the communication ports of said monitoring and communication module.

16. The metering assembly of claim 15 wherein said meter enclosure includes a side facing the third side of said module enclosure, said side facing the third side of said module enclosure having a plurality of openings for accepting said communication connectors.

17. The metering assembly of claim 14 wherein said means for mounting said communication bracket to said frame offset from the third side of said monitoring and communication module includes means for mounting said communication bracket to said means for mounting said display module.

18. The metering assembly of claim 14 wherein said communication bracket comprises a U-shaped board having a base and a pair of legs, a printed circuit board mounted to said base between said legs, said printed circuit board carrying said at least one communication connector and having at least one communication cable electrically connected between said at least one communication port of said monitoring and communication module and said at least one communication connector.

19. The metering assembly of claim 18 wherein said communication bracket is made of a composite material.

20. The metering assembly of claim 18 wherein said means for mounting said display module to said frame offset from the second side of said monitoring module comprises a first bracket having a first leg mounted proximate the second side of said frame and having a second leg offset from the second side of said monitoring module, a second bracket having a first leg mounted proximate the third side of said frame and having a second leg offset from the second side of said monitoring module; and a pair of U-shaped brackets, with each of said U-shaped brackets having a pair of legs mounted to corresponding portions of said display module and having a base mounted to the second legs of the first and second brackets; and wherein said communication bracket includes a first fastener secured to the first leg of said first bracket and a second fastener secured to the first leg of said second bracket.

21. A metering assembly comprising:

a meter enclosure adapted for housing an analog kWh meter, said meter enclosure having an opening and carrying a plurality of stabs;

a frame including a top side and a bottom side, the bottom side of said frame carrying a plurality of electrical terminals, the stabs of said meter enclosure electrically engaging the electrical terminals of said frame;

means for securing said frame within the opening of said meter enclosure;

a display module including a display port and a metering display driven from said display port;

a monitoring module including a monitoring unit, a display port driven by said monitoring unit, and a module enclosure having a top side, a front side and a bottom side, the top side of said monitoring module being mounted to the top side of said frame, the bottom side of said monitoring module having a plurality of electrical connections to the electrical terminals of the bottom side of said frame, the display port of said monitoring module being electrically connected to the display port of said display module; and means for mounting said display module to said frame offset from the front side of said monitoring module.

* * * * *